United States Patent
Tsironis

(10) Patent No.: US 9,722,569 B1
(45) Date of Patent: Aug. 1, 2017

(54) MULTI-BAND LOW FREQUENCY IMPEDANCE TUNER

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 150 days.

(21) Appl. No.: 14/302,472

(22) Filed: Jun. 12, 2014

Related U.S. Application Data

(60) Provisional application No. 61/834,028, filed on Jun. 12, 2013.

(51) Int. Cl.
- *H03H 7/40* (2006.01)
- *H03H 7/38* (2006.01)
- *H01G 5/16* (2006.01)

(52) U.S. Cl.
CPC .............. *H03H 7/38* (2013.01); *H01G 5/16* (2013.01); *H03H 2007/386* (2013.01)

(58) Field of Classification Search
CPC .................................................... H03H 7/40
USPC ....... 333/32, 17.3, 263, 126; 334/78, 81–83; 361/287, 289, 290, 292, 293, 294, 296, 361/298.1, 299.1
See application file for complete search history.

(56) References Cited

U.S. PATENT DOCUMENTS

| | | | | |
|---|---|---|---|---|
| 1,976,571 A * | 10/1934 | Loftis | ...... | H03J 1/10 361/299.1 |
| 2,250,329 A * | 7/1941 | Duerk | ...... | H01G 5/38 29/25.41 |
| 2,282,215 A * | 5/1942 | Drake | ...... | H01G 5/38 361/299.1 |
| 2,718,617 A * | 9/1955 | Connor | ...... | H01G 4/258 361/282 |
| 3,789,331 A * | 1/1974 | Miner | ...... | H03J 3/20 334/78 |
| 7,646,267 B1 | 1/2010 | Tsironis | | |

* cited by examiner

*Primary Examiner* — Stephen E Jones

(57) ABSTRACT

A multi-band, electro-mechanical programmable impedance tuner for the frequency range between 10 and 200 MHz uses cascades of three or more continuously variable mechanical capacitors interconnected with sets of low loss flexible or semi-rigid cables; for each frequency band a different set of cables and capacitors are used. The cables and/or variable capacitors inside each tuning block are switchable manually or remotely. Multi-section variable capacitors are also used. Instantaneous impedance tuning is effectuated by changing the state of the capacitors using electrical stepper motors. The tuner is calibrated using a vector network analyzer and the data are saved in the memory of the control computer, which then allows tuning to any user defined impedance within the tuning range. Reflection factor values between 0 and higher than 0.9 can be obtained using this tuner at all frequency bands.

2 Claims, 14 Drawing Sheets

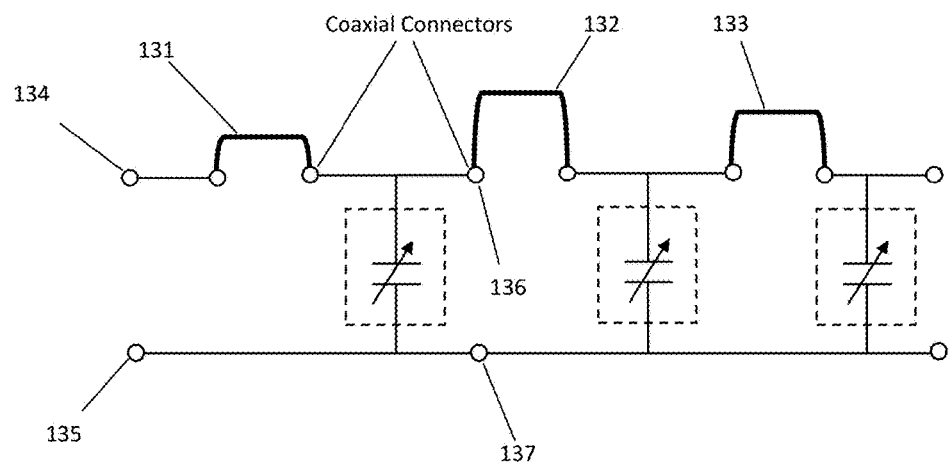
Figure 13a:
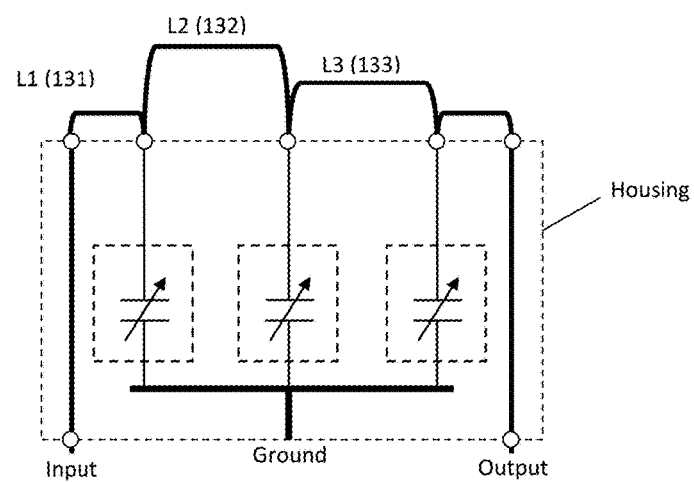
Figure 13b), top view.

MULTI-BAND LOW FREQUENCY IMPEDANCE TUNER

PRIORITY CLAIM

The present application claims priority on provisional application 61/834,028, filed on Jun. 12, 2013 under the title: Multi-band Low frequency impedance tuner.

CROSS-REFERENCE TO RELATED ARTICLES

[1] "Load Pull Measurements" http://en.wikipedia.org/wiki/Load_pull
[2] "How does a Slide Screw Tuner (frequency>100 MHz) work?" Website, Focus Microwaves Inc., http://www.focus-microwaves.com//questions/how-does-slide-screw-tuner-frequency100mhz-work
[3] Product note 41, "Computer Controlled Microwave Tuner", Focus Microwaves Inc., January 1998.
[4] U.S. Pat. No. 7,646,267, Low frequency electro-mechanical impedance tuner
[5] ADS, Advanced Design System, Agilent Technologies; http://eesof.tm.agilent.com
[6] Microwave Office 2004 Design Suite; http://www.m-woffice.com

BACKGROUND OF THE INVENTION

This invention relates to RF load and source pull testing of medium and high power RF transistors and amplifiers using remotely controlled electro-mechanical impedance tuners in the frequency range from below 10 MHz and up to 1 GHz.

Modern design of high power RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models [5][6].

A popular method for testing and characterizing such microwave components (transistors) in the non-linear region of operation is "load pull". Load pull is a measurement technique employing microwave tuners and other microwave test equipment. The microwave tuners are used in order to manipulate the microwave impedance conditions under which the Device Under Test (DUT, or transistor) is tested [1]; this document refers hence to "impedance tuners", in order to make a clear distinction to "tuned receivers (radios)", popularly called elsewhere also "tuners" because of the included tuning circuits.

Impedance tuners consist, in general, of a transmission line and a number of serial or parallel elements, fixed or adjustable, which create a variable reactance, allowing thus the synthesis of various impedances (or reflection factors) covering parts or the totality of the Smith chart (the normalized reflection factor area).

The relation between reflection factor and impedance is given by GAMMA, $(Z-Z_o)/(Z+Z_o)$, where Z is the complex impedance $Z=R+jX$ and Zo is the characteristic impedance. A typical value used for Zo is Zo=50 Ohm.

At frequencies below a few hundred MHz impedance tuners based on the slide-screw principle [3] are impractical, since they must be at least ½ of wavelength ($\lambda$) long. At 100 MHz the electromagnetic propagation wavelength $\lambda_o$ in air (or vacuum) being approximately 3 meters, it is obvious that such metallic structures, manufactured at high precision are very expensive and cumbersome to use in a laboratory. An alternative is to use a cascade of tuning sections based on variable capacitors and sections of transmission line [4].

The shortcoming of the tuners described in [4] is their limited bandwidth; as can be seen in FIGS. 2 and 3 the impedance coverage varies significantly from one frequency to another, especially because the sections of transmission line between capacitors are fixed, but also because variable capacitors have limited "dynamic range" or "maximum to minimum" capacitance values (Cmax/Cmin, typically 10:1 to 20:1); or capacitors with Cmax=100 pF have a minimum Cmin of around 5 to 10 pF, due to fringe field leakage and spurious elements. In traditional slide screw tuners it is the maximum value of the capacitance between probe (slug) and center conductor of the airline the limiting factor, since (a) the probe can travel horizontally [2] and (b) the minimum capacitance is virtually zero, or Cmax/Cmin close to Infinite. In the case of low frequency tuners there is enough capacitance (Cmax), but the minimum capacitance is not zero and phase between capacitors is not continuously adjustable, leading to situations that, whereas at certain frequencies there is a good coverage of the Smith chart (example f=2 GHz, FIG. 2), at other frequencies (example f=3 GHz, FIG. 3) there is a crowded area of impedances but also a lot of "empty" (or "un-reachable") space, where the tuner cannot generate impedances.

To correct this shortcoming we propose tuners in which
a) the lengths of transmission line between capacitors, and
b) the capacitors themselves can be exchanged in situ (i.e. without disassembling the unit), either manually or remotely. The new low frequency tuner comprises a cascade of at least three remotely adjustable variable capacitance blocks connected using exchangeable lengths of low loss transmission lines made using coaxial flexible or semi-rigid cables (FIGS. 4, 5, 9, 10, 13 and 14).

BRIEF DESCRIPTION OF THE SEVERAL VIEWS OF THE DRAWINGS

The invention and its mode of operation will be more clearly understood from the following detailed description when read with the appended drawings in which:

FIGS. 13a) depicts the electrical scheme and 13b) the top view of the assembly of a wideband LC tuner with manually exchangeable lines (coax cables) in form of back-panel jumpers.

DETAILED DESCRIPTION OF THE INVENTION

Figure 10:
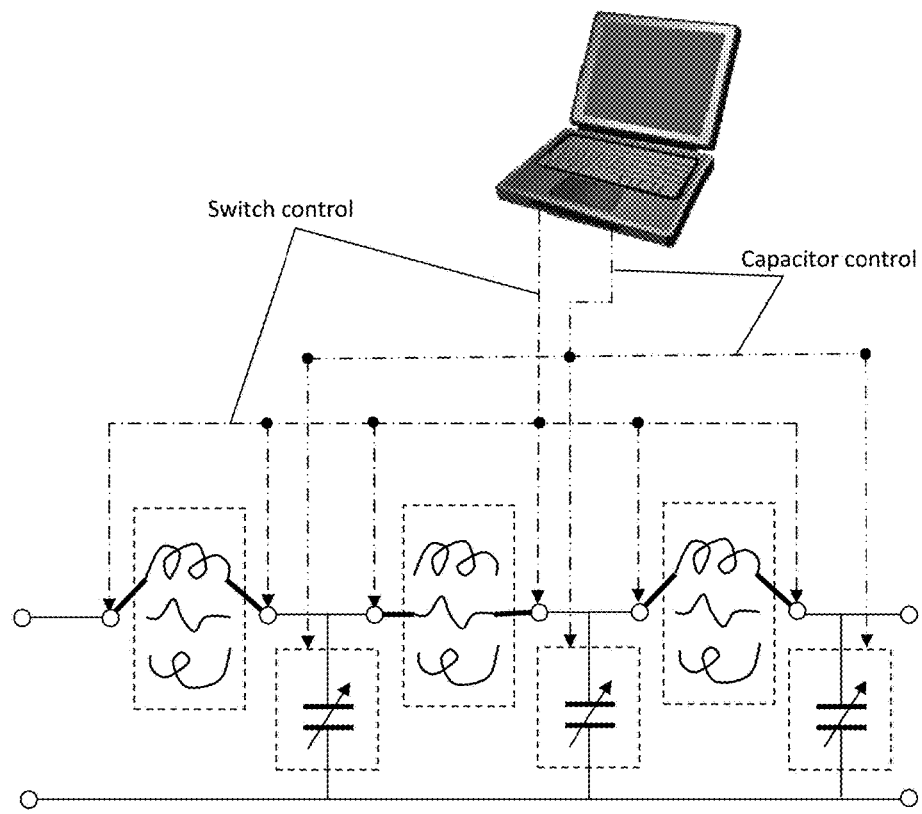
FIG. 10 depicts computer control of variable capacitors and multiple line sections.
Figure 11:
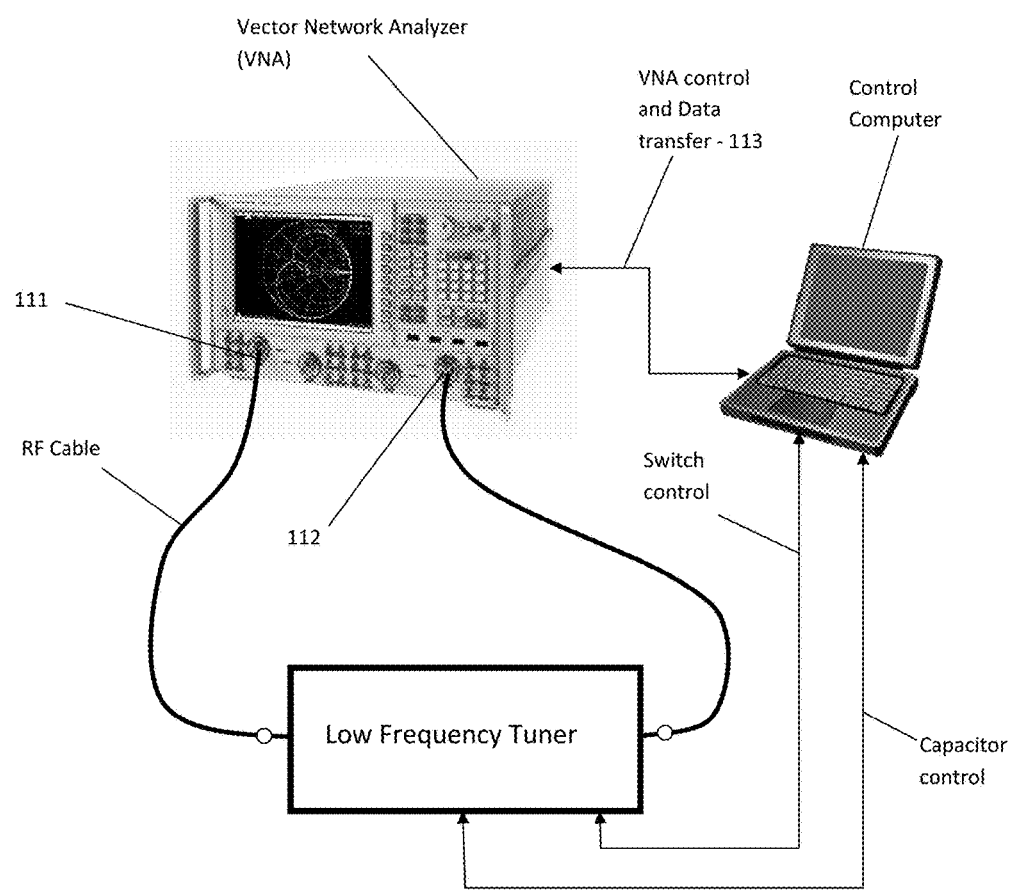
FIG. 11 depicts calibration setup of wideband LC tuner.

This invention describes a radio frequency, computer controlled electro-mechanical impedance tuner apparatus, which is compact in size, easy to manufacture, which can be calibrated using standard measurement techniques and which allows synthesizing impedances at various frequencies in the range of below 10 and up to 1000 MHz. The variable capacitors used in the tuner are controlled by electrical stepper motors, driver electronics and a control computer (FIGS. 10, 11), which places them to certain positions, measures the scattering parameters (s-parameters) of the tuner on a vector network analyzer (VNA, FIG. 11) using a standard LAN, USB or GPIB connection (111) and saves them in calibration files, ready to use.

Figure 1:
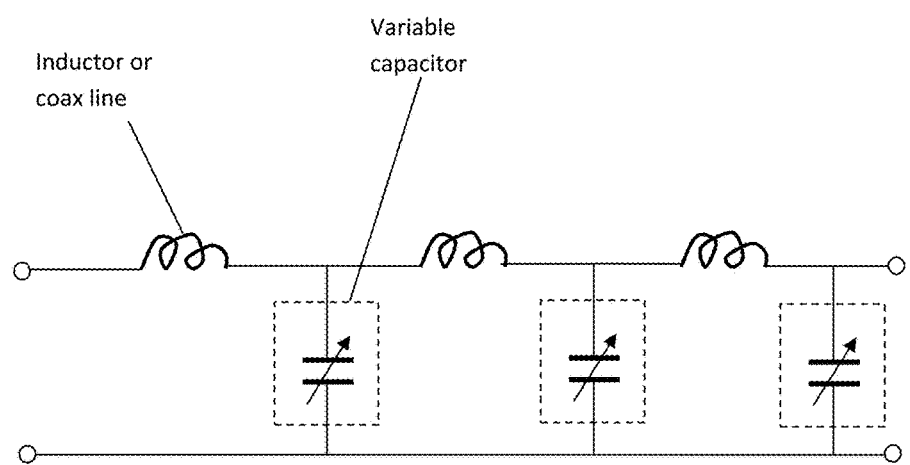
FIG. 1 depicts Prior Art: Low frequency (LC) tuner concept.
Figure 2:
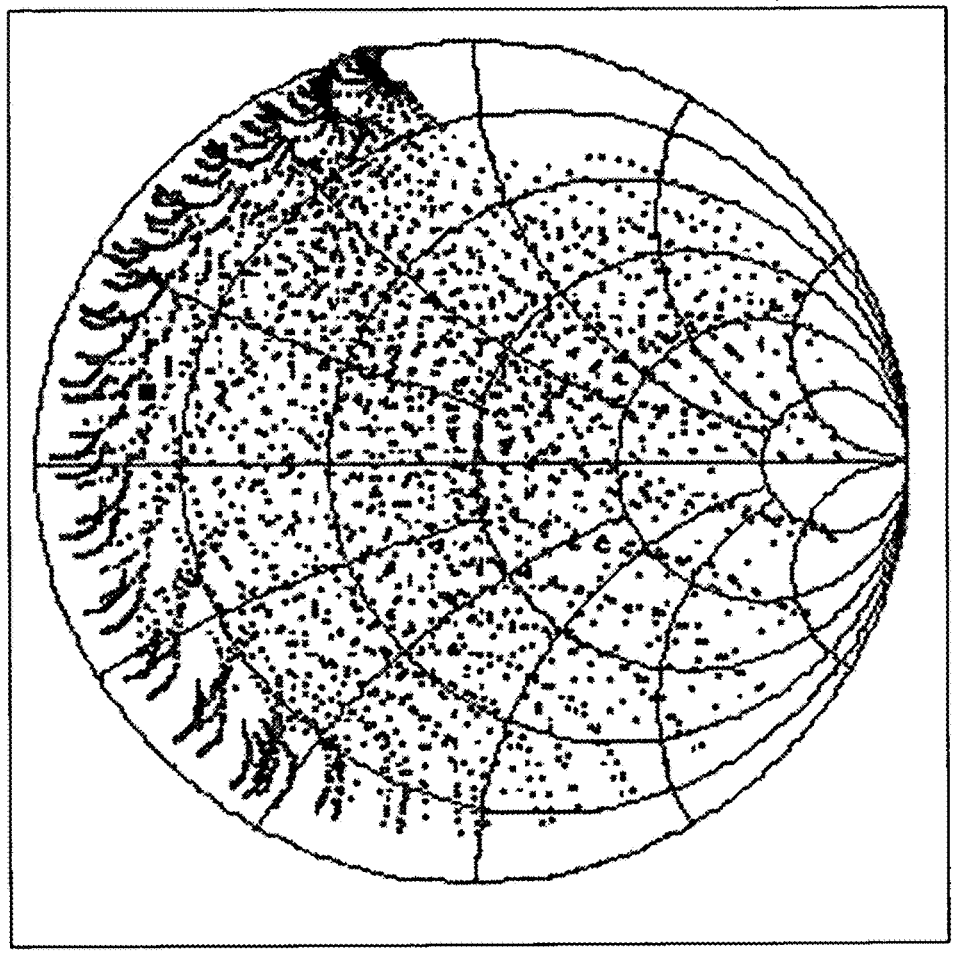
FIG. 2 depicts Prior Art: in-band impedance coverage of 3 stage LC tuner.
Figure 3:
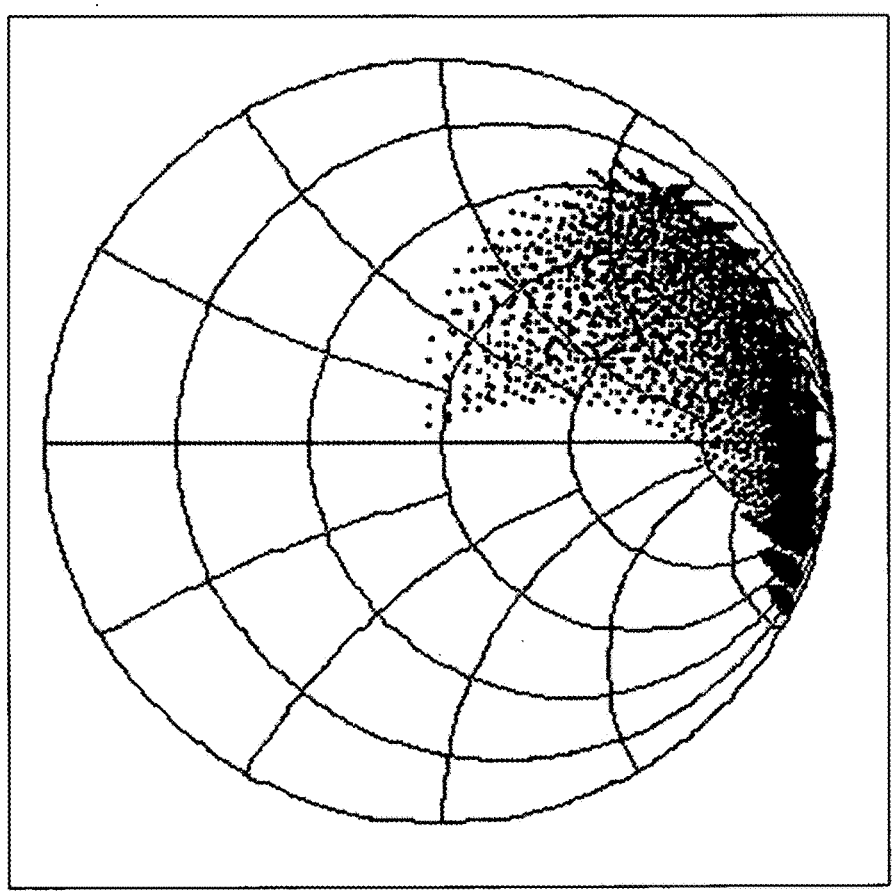
FIG. 3 depicts Prior Art: Out-of-band impedance coverage of 3 stage LC tuner.
Figure 4:
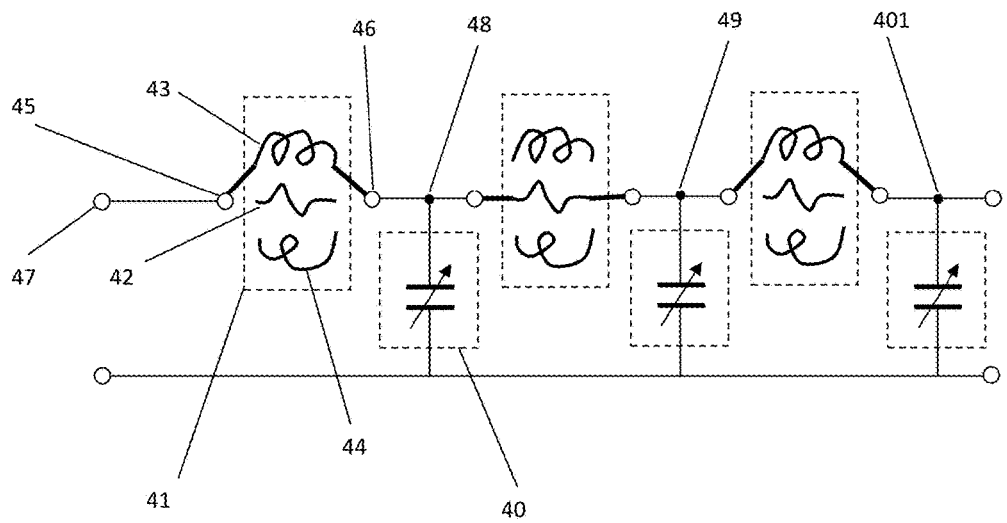
FIG. 4 depicts wideband 3 stage LC tuner using multiple lines (inductors, L1 to L9) and RF switches (SW1 to SW6).
Figure 5:
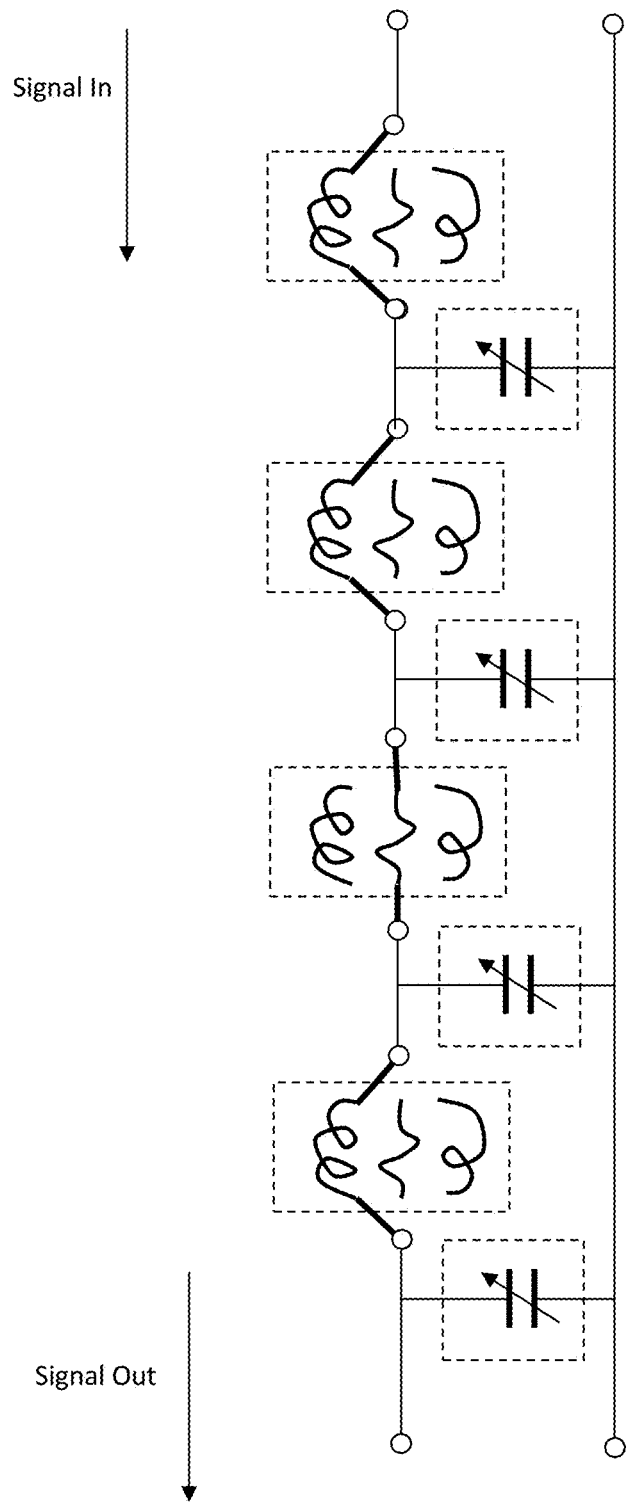
FIG. 5 depicts wideband 4 stage LC tuner using multiple coaxial lines or inductors.

The basic configuration of the wideband tuner using one set of variable capacitors and three sets of variable lengths of cable is shown in FIG. 4: it uses cable modules comprising a number of cable sections of different length (42, 43, 44), which are switchable by SPDT (single pole double throw) RF switches (45, 46). Any combination of cable length of each block (41) is therefore possible thus maximizing the frequency coverage of the tuner.

Figure 9:
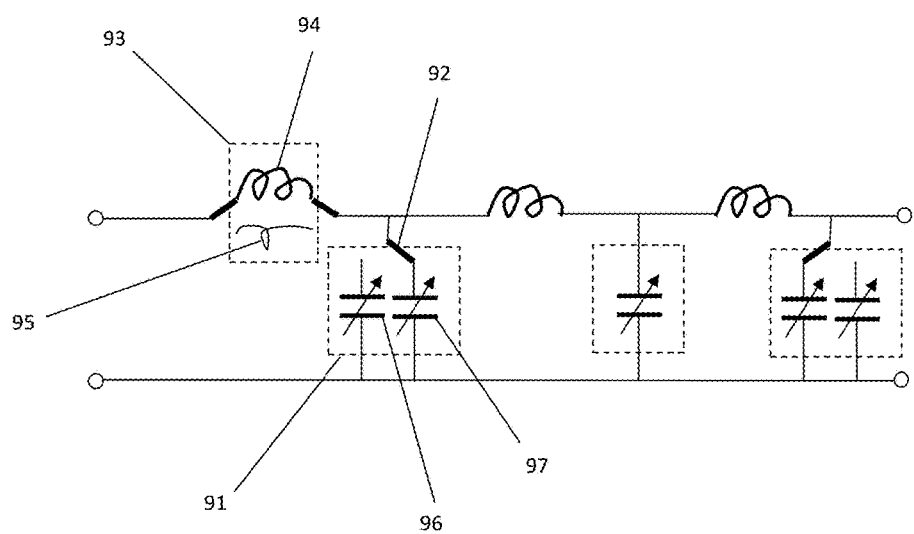
FIG. 9 depicts the wideband LC tuner combining multiple lines and variable capacitors.

Capacitors can also be switched. This is shown in FIG. 9; here two sets of capacitors (96, 97) are combined with two sets of cable (94, 95). A combination of multiple capacitor/multiple cable or single capacitor/single cable or double capacitor/single cable is possible, all such combinations shown in FIG. 9.

When an impedance synthesis (tuning to impedance) is requested by a user, the computer loads the calibration data from the hard-disk into its active memory and scans through them to find the closest match between the calibrated point and the user-defined target. After the first step a second search is performed, in which interpolated data between calibration points are used and a final match is found, usually very close or identical within approximately 1% or better of the requested impedance value.

Figure 6:
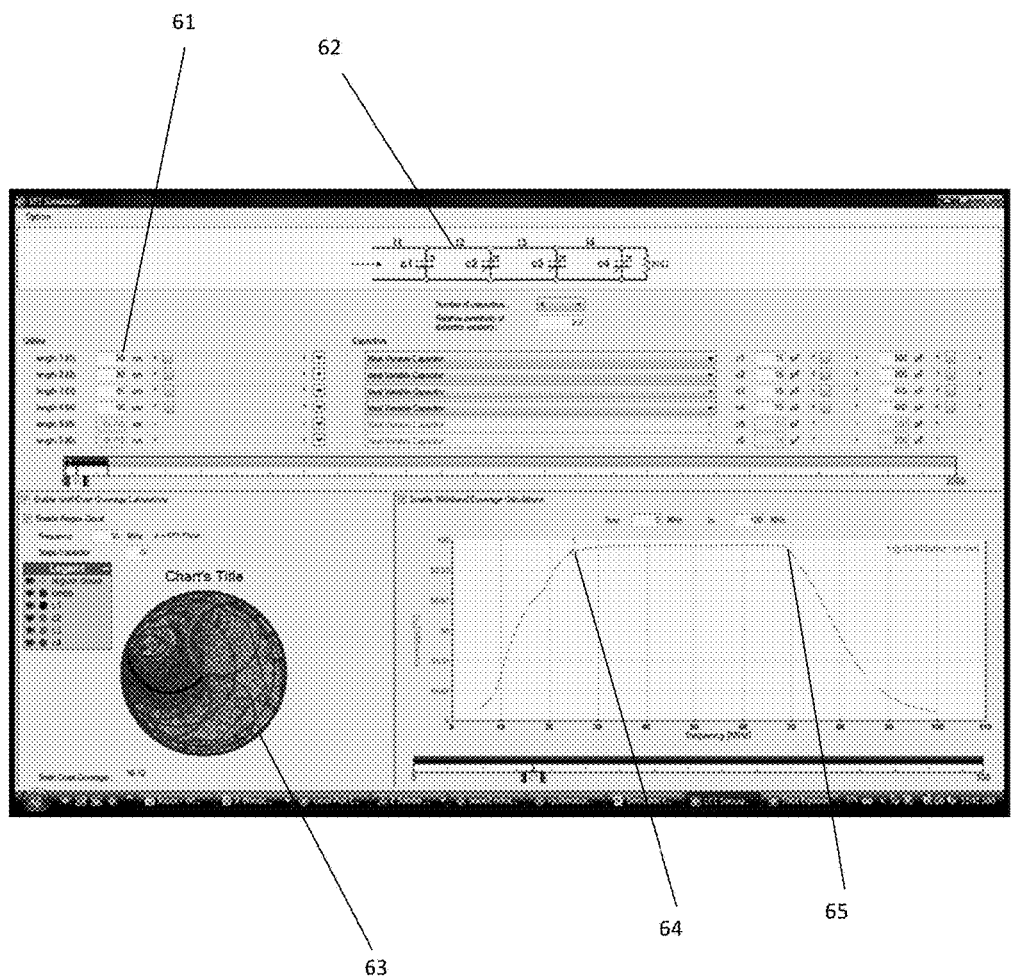
FIG. 6 depicts the frequency coverage of 4 stage LC tuner (simulation tool), Fmin=20 MHz, Fmax=70 MHz.

Because of the nature of the variation of the capacitive elements of this tuner and the fact that the electrical distance between these capacitive tuning elements cannot be varied, the coverage of the Smith chart impedance area is not homogenous over a large frequency band (FIGS. 6, 7); to increase the bandwidth the electrical lengths of the cables and size of the capacitors shall be changed. For example a capacitor which has 17 to 1573 pF capacitance should work from 10 MHz to 30 MHz according the simulation, with cable lengths of L1=30 cm, L2=260 cm, L3=250 cm, L4=200 cm (FIG. 6). Capacitor values between 45 and 1000 pF, cover 20 MHz to 60 MHz, with cable lengths L1=30 cm, L2=90 cm, L3=80 cm, L4=70 cm. Capacitor values of 15 pF to 410 pF, cover 60 MHz to 150 MHz, with cable (electrical) lengths L1=30 cm, L2=50 cm, L3=40 cm, L4=35 cm.

The high frequency limit for this apparatus lies in the fact that the RF cables required to interconnect the capacitance blocks and the interconnections themselves will introduce insertion losses and the interconnections to the capacitors will introduce parasitic (fringe) inductances and residual capacitances, which will degrade the maximum reflection factor attainable and thus the tuning capability of the apparatus. Even though it is possible to design an impedance tuner also at higher frequencies using the same principle in the Gigahertz range, the practical interest is low.

Figure 7:
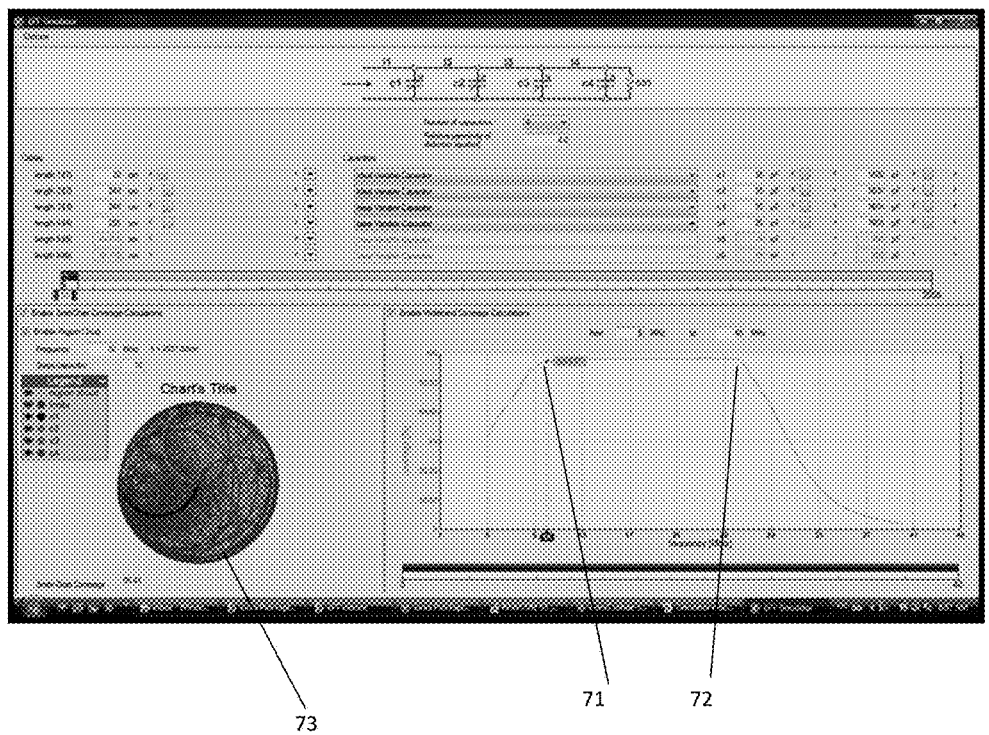
FIG. 7 depicts the frequency coverage of 4 stage LC tuner (simulation), Fmin=10 MHz, Fmax=30 MHz.

It has to be said from the beginning that, even though the proposed apparatus can be used over a wide frequency range, it cannot be used at all frequencies at the same time. It can only be re-configured for a frequency range each time by changing the interconnecting cables (61, 62). Proper circuit simulation techniques help identifying which set of cables will be best for which frequency range (64, 65 and 71, 72) for maximum Smith chart coverage (63, 73) and thus sets of such cables must be available for re-configuring the apparatus, before calibrating and using it (FIGS. 6 and 7).

Figure 8:
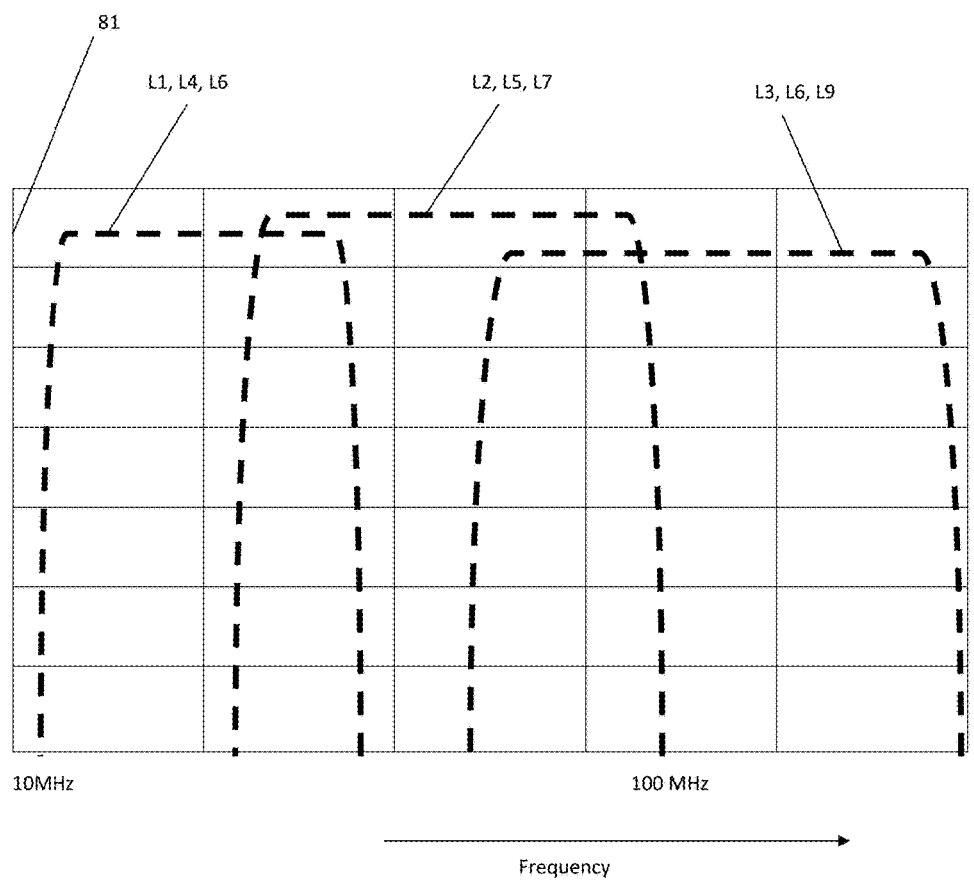
FIG. 8 depicts the Wideband LC tuner reflection factor; using combinations of multiple line sections (compare FIGS. 6, 7).

FIG. 8 shows typical maximum reflection factor tuning capacity of a three-segment LC tuner for various combinations of coaxial cable lengths between capacitors. Axis (81) is the maximum attainable reflection factor (maximum value=1, means total reflection). It can be seen that, using 3 triple sets of cables L1 to L9 (a total of 9) will allow a total contiguous frequency coverage of over one decade (Fmax/Fmin>10).

A number of cable lengths (94, 95) can be combined with associated capacitors (96, 97) of varying minimum capacitance (Cmin) and maximum capacitance (Cmax) values (FIG. 9).

Typical maximum values of capacitances needed to generate enough reflection are 0 to 20 pF at 1 GHz, 0 to 100 pF at 200 MHz, 0 to 200 pF at 100 MHz, 0 to 600 pF at 30 MHz and 0 to 2000 pF at 10 MHz. Hereby the lowest value of 0 pF is an approximation, since no such capacitor exists. 0 pF here means the minimum value when the capacitor blocks are disengaged. Mechanically adjustable capacitances can be set to minimum values around 0 pF by withdrawing the floating terminal from the grounded one, which corresponds to the initialization state of this tuner.

The true advantage of the proposed segmented tuner apparatus lies in the fact that the interconnecting cables between tuning blocks (15, 16) may be ordinary low cost and low loss flexible or semi-rigid cables, which can be configured in coil form to reduce space, because with decreasing frequencies the size of traditional slide screw tuners becomes big, surpassing 1.5 meters or more at 100 MHz. Since size is inversely proportional to frequency, a 10 MHz slide screw tuner would have to be roughly 15 meters long, which of course is prohibitive for this type of application.

Figure 12:
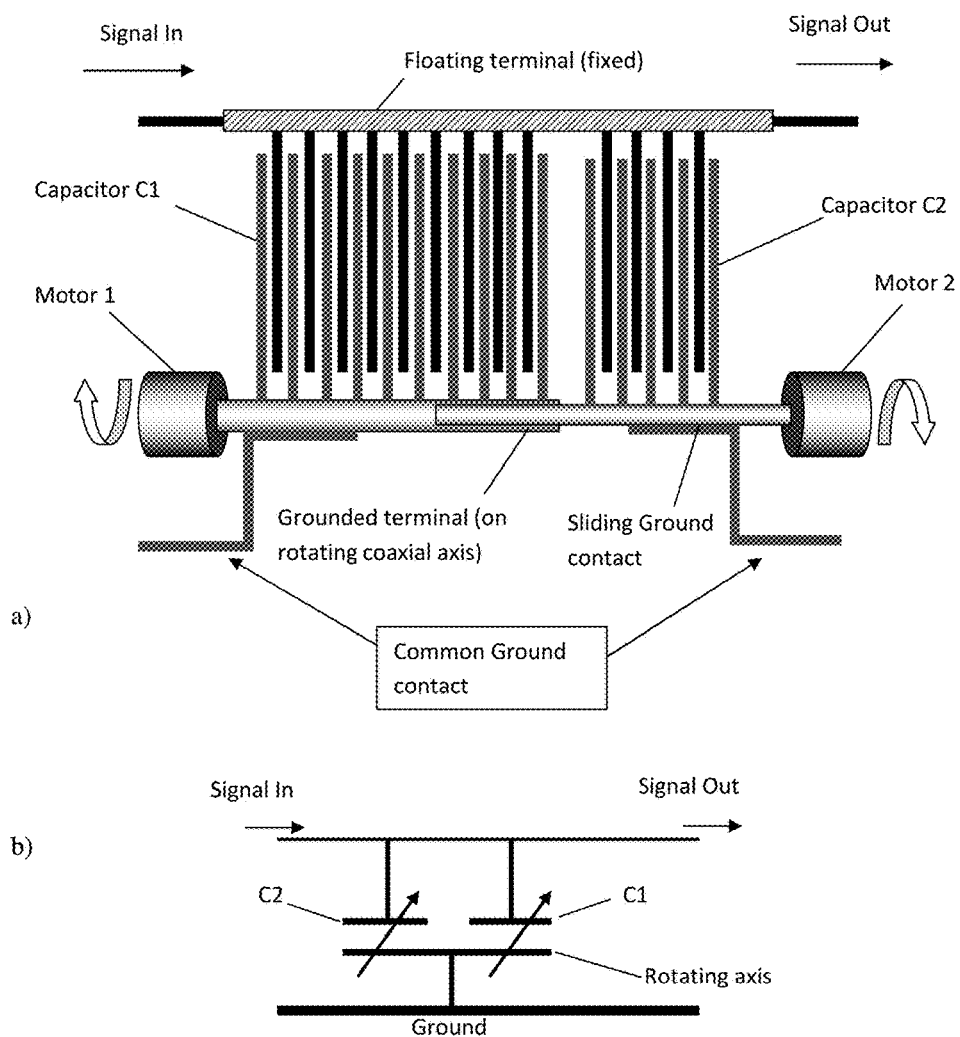
FIG. 12 depicts a double axis—double rotative capacitor—motors 1 and 2 turn independent; a) layout, b) electrical equivalent.
Figure 14:
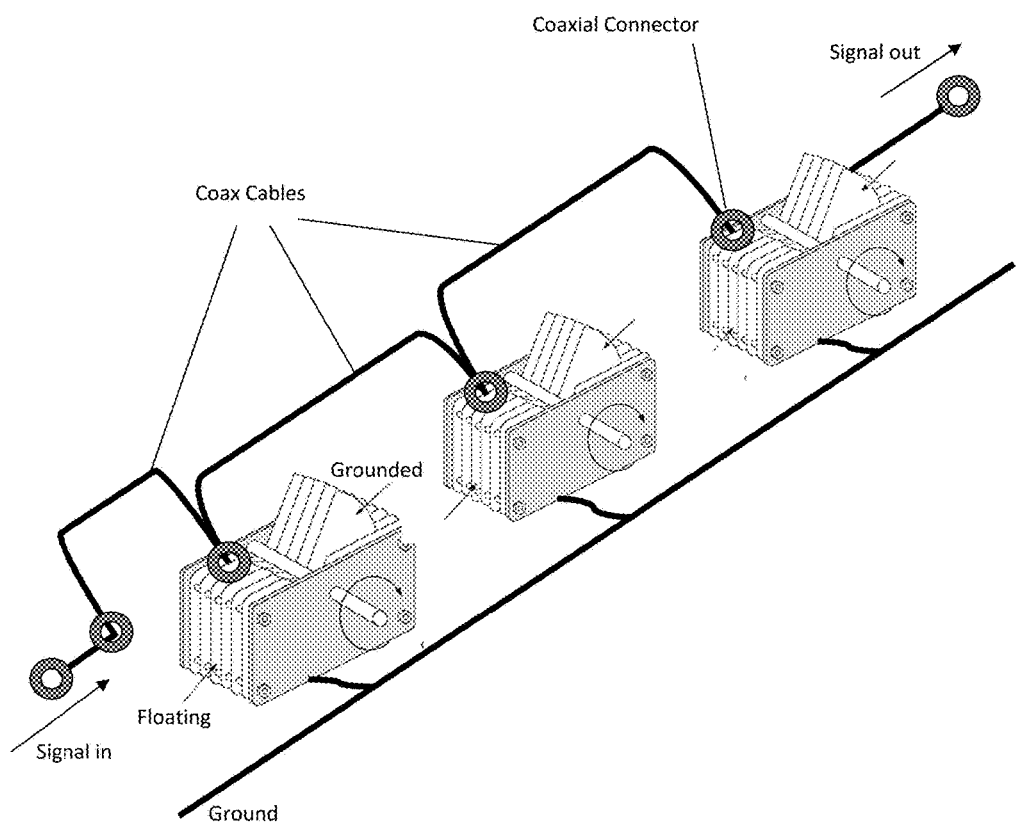
FIG. 14 depicts perspective view of 3 stage LC tuner with exchangeable lines (coax cables).

The operation bandwidth of LC tuners is further increased by using, in addition to exchangeable coaxial cables or inductors, also exchangeable variable capacitors. This can be done either by connecting in parallel individual capacitors, which risks increasing parasitic (fringe) interconnection elements, or by introducing "common axis" capacitors (FIG. 12); the capacitor shown in FIG. 12 uses a coaxial grounded axis which carries a set of parallel blades each, independently adjustable and insertable into the floating fixed set of blades. This capacitor comprises, in fact three capacitors in one: Capacitor 1 (C1) corresponds to the larger set of blades, capacitor 2 (C2) to the smaller set of blades and capacitor 3 (C3) to the combination of both. If minimum and maximum values are attributed to the capacitors, then this triple capacitor can be adjusted independently between C2min and (C3max, C1max+C2max); this is important, because fringe elements at high capacitance values (which are present in C1 but not in C2) will limit (through "self-resonance) the maximum frequency of operation, and those are minimized in the case of C2. Each section of the axis of this capacitor is attached to an electrical stepper motor which is remotely controlled by a control processor allowing individual adjustment of the capacitances C1, C2 or C1+C2.

An alternative method for broadening the operation frequency band of a low frequency tuner is shown in FIG. 13. Hereby the variable capacitors remain the same, but the lengths of cable between them are manually changed. This can be done easily by having the cables connected from outside the tuner housing, in form of jumpers, as shown in FIG. 13*b*).

The segmented impedance tuner has its highest practical value when used as an independent component and can be directed to "synthesize" RF impedances at will. This can only be achieved with sufficient accuracy only if the tuner can be calibrated ahead of time and its calibrations can be used by a control computer and appropriate software to determine the capacitor's settings leading to the requested impedance. Using electrical models are used to represent the overall behavior of the tuner and optimize the length of the coaxial lines and the capacitors but do not achieve the accuracy of direct measurements.

However, before the tuner can be calibrated such as to be able to synthesize impedances in either a certain area of the Smith chart, or covering the whole area of the Smith chart, the appropriate electrical distance between capacitor blocks must be determined. This can be done in two steps: Step one consists in characterizing each capacitor block (two-port) separately and save the two-port s-parameters and step two consists in cascading the two-port data in a circuit analysis and simulation computer program, which allows modifying numerically the length of the cable and thus the electrical distance between capacitor blocks and simulating numerically and optimizing the cable lengths to achieve the expected impedance coverage on the Smith chart of the cascade. These steps are shown in FIGS. 6 and 7.

The first step of the above procedure consists in connecting and calibrating each capacitor block (two-port) on a vector network analyzer (VNA), which has been pre-calibrated at a number of pre-selected frequencies (FIG. 11); each tuning block has an input port (134,135), which consists of a through connection of the floating terminals and an output port (136,137), which consists of a through connection of the grounded terminals. The calibration of each block consists in connecting the input port to the first port (111) of the VNA and the output port to the second port (112) of the VNA. In this configuration the VNA measures scattering parameters (s-parameters) of the capacitance block (or two-port), after correcting for the effect of the RF cables (de-embedding) through appropriate VNA calibration.

During the calibration process the stepper motor is directed by the control computer to insert the blades of the mobile part of the capacitor (FIG. 11) into the spaces between fixed blades in order to increase the capacitance value, while reading the four scattering parameters (s-parameters) from the VNA using standard communication cable (113) and protocol. S-parameters of the capacitor block are measured at typically 10 to 20 positions of the mobile blades corresponding to minimum and maximum capacitance values, and saved in a calibration file in the form Sij(Yi); where Yi describes the common area between fixed and rotating blades (Y=0 corresponds to minimum capacitance or when the blades are decoupled, Y=Ymax corresponds to maximum overlap of the blades and maximum capacitance). This procedure is repeated for each capacitance block and each frequency of interest and the data are saved in successive calibration files for later use.

In a second step the previously generated block calibration files are loaded into a computer running a, commercially available, network analysis software program, like ADS of Agilent [5] or Microwave Office [6]. There are several such software packages on the market available, some also as freeware. These analysis programs allow cascading the s-parameter files of the capacitor blocks and connecting them numerically with electrical cables of variable length.

These computations generate a new s-parameter matrix in the form Sij(Y1, Y2, Y3), where Y1, Y2, Y3 are the positions of the mobile part of each capacitor. If each capacitor has been calibrated for 20 vertical positions, allowing a close to equal distribution of reflection factor from 0 to maximum (0.9 or 0.95), then the combination s-parameter matrix will include 20×20×20=8,000 calibration points; this is sufficient to be able to tune to any area of the Smith chart, if the electrical lengths of the interconnecting cables are appropriately chosen for best Smith chart coverage.

Then all simulated reflection factor points (S11(Y1, Y2, Y3)) of the cascade of three tuning blocks, where Y1, Y2 and Y3 are the positions in the individual tuning blocks, are plotted on the Smith chart at a selected frequency and the operator can decide which combination of electrical length between capacitor blocks is best suited for the specific impedance coverage on the Smith chart he aims (FIG. 6).

Impedance synthesis using s-parameters of tuners is a specific procedure related to specific tuners which shall not be elaborated further here. This does not, however, limit the scope of the invention itself, since the invention relates to the apparatus and its calibration rather than the tuning technique and presumes appropriate control software allowing calibration and tuning to be available. The calibration procedure has been laid out briefly only in order to manifest the fact that this wideband tuner has been, in effect, used for impedance synthesis, when calibrated and the calibration data used accordingly.

What I claim as my invention is:

1. A two-segment variable parallel blade rotary capacitor comprising a first capacitance segment and a second capacitance segment, said segments comprising a multitude of parallel metallic blades each and are divided in two sets, a first set being mounted on rotating axis and a second set being mounted on a fixed body, said blades being inserted parallel to each other interdigital, whereby rotation of said axis allows the overlapping area between said sets of blades to vary between a minimum and a maximum value, and whereby said rotating axis is split in two coaxial sections, each said section rotating independently and controlling one set of blades of said capacitor.

2. A capacitor as in claim 1, whereby each section of said coaxial axis is attached to an electric stepper motor, said motor being remotely controlled by a control processor.

* * * * *